US009466776B1

(12) United States Patent
Hsu

(10) Patent No.: US 9,466,776 B1
(45) Date of Patent: Oct. 11, 2016

(54) LIGHT EMITTING LIGHT STRING WITH ENHANCED HEAT DISSIPATING EFFICIENCY

(71) Applicant: Wei-Lin Hsu, Hsinchu (TW)

(72) Inventor: Wei-Lin Hsu, Hsinchu (TW)

( * ) Notice: Subject to any disclaimer, the term of this patent is extended or adjusted under 35 U.S.C. 154(b) by 0 days.

(21) Appl. No.: 14/984,984

(22) Filed: Dec. 30, 2015

(51) Int. Cl.
*H01L 27/15* (2006.01)
*H01L 33/64* (2010.01)
*H01L 33/48* (2010.01)

(52) U.S. Cl.
CPC ........... *H01L 33/647* (2013.01); *H01L 27/153* (2013.01); *H01L 33/486* (2013.01); *H01L 33/641* (2013.01)

(58) Field of Classification Search
CPC ..... H01L 27/153; H01L 33/00; H01L 33/08; H01L 33/48; H01L 33/486; H01L 33/64; H01L 25/0753
See application file for complete search history.

(56) References Cited

U.S. PATENT DOCUMENTS

2009/0046461 A1* 2/2009 Fan ........................... F21V 3/02 362/242
2009/0230417 A1* 9/2009 Tsai ...................... H01L 33/486 257/98
2011/0110089 A1* 5/2011 Chang ................... F21V 19/001 362/249.06
2012/0273963 A1* 11/2012 Mirsky ............... H01L 23/3735 257/774
2015/0377695 A1* 12/2015 Chang ................... G01J 1/0252 250/208.2
2016/0057850 A1* 2/2016 Kang ..................... H05K 1/028 361/749
2016/0091147 A1* 3/2016 Jiang ......................... F21K 9/17 315/205
2016/0190397 A1* 6/2016 Lin ....................... H01L 33/483 257/98

* cited by examiner

*Primary Examiner* — Mohsen Ahmadi
(74) *Attorney, Agent, or Firm* — Muncy, Geissler, Olds & Lowe, P.C.

(57) ABSTRACT

A light emitting light string with enhanced heat dissipating efficiency includes a first conductive line and a second conductive line disposed in parallel, and at least one surface mounted light emitting diode (LED) disposed across and forming an electrical connection with the first conductive line and the second conductive line. Each of the first conductive line and the second conductive line is formed by a plurality of segments and a conductive heat dissipating material. Each segment includes a conductive core. Each of two ends of the conductive core is an exposed section. The remaining region of the conductive core includes an insulating layer. The conductive heat dissipating material connects the exposed sections of the adjacent segments to form an electrical contact pad region. The surface mounted LED is disposed on one of the electrical contact pad regions formed at the first conductive line and the second conductive line.

12 Claims, 9 Drawing Sheets

LIGHT EMITTING LIGHT STRING WITH ENHANCED HEAT DISSIPATING EFFICIENCY

FIELD OF THE INVENTION

The present invention relates to a light emitting light string, and particularly to a light emitting light string that performs light emitting by a plurality of light emitting elements connected in parallel.

BACKGROUND OF THE INVENTION

As people increasingly value holiday celebrations, many manufacturers have started to provide household decorations matching the holiday spirits. Taking a Christmas light for instance, FIG. 1 shows a sectional view of such conventional Christmas light. A common Christmas light is usually formed by two parallel conductive lines 6 and a plurality of light emitting elements connected across these two conductive lines 6. The flexibility of the two conductive lines 6 enables the Christmas light to be installed at various places according to actual requirements. The conventional Christmas light is likely deployed outdoors. To prevent the two conductive lines 6 from humidity that may cause a failure in conducting electricity, manufacturers of Christmas lights frequently dispose an insulating layer 61 at an outer periphery of each of the two conductive lines 6, so as to prevent humidity from entering the conductive lines 6. However, with the popularity of light emitting diodes (LED) 7, there are also manufacturers that apply the LED 7 on Christmas lights. When the LED 7 is powered on, a waste heat 71 of the LED 7 is accumulated at a rear portion of the LED 7 and further enters the two conductive lines 6. As the surfaces of the two conductive lines 6 are covered by the insulating layer 61, the waste heat 71 is confined at the two conductive lines 6. When the Christmas light is lighted for an extensive period of time, the excessively accumulated waste heat 71 causes the two conductive lines 6 to rise in temperature, and heats and melts the insulating layer 61 to reveal the two conductive lines 6. As a result, the Christmas light may still malfunction due to the two conductive lines 6 being affected by humidity to even lead to an accident of short circuitry and electrical fire.

SUMMARY OF THE INVENTION

It is a primary object of the present invention to solve of the issue of accumulated waste heat in a conventional solution.

To achieve the above object, the present invention provides a light emitting light string with enhanced heat dissipating efficiency. The light emitting light string includes a first conductive line, a second conductive line, and at least one surface mounted light emitting diode (LED). The first conductive line is formed by a plurality of first segments. Every two adjacent first segments are connected by a conductive heat dissipating material in between. Each of the first segments includes a first conductive core. The first conductive core has each of two ends thereof as a first exposed section, and the first exposed sections are defined into a first exposed pad region and a second exposed pad region. An exterior of the remaining region of the first conductive core is covered by a first insulating layer. The conductive heat dissipating material connects the first exposed pad region and the second exposed pad region of every two adjacent first segments to form a first electrical contact pad region. The second conductive line is formed by a plurality of second segments. Every two adjacent second segments are connected by the conductive heat dissipating material in between. Each of the second segments includes a second conductive core. The second conductive core has each of two ends thereof as a second exposed section, and the second exposed sections are defined into a third exposed pad region and a fourth exposed pad region. An exterior of the remaining region of the second conductive core is covered by a second insulating layer. The conductive heat dissipating material connects the third exposed pad region and the fourth exposed pad region of every two adjacent second segments to form a second electrical contact pad region. Each of the surface mounted LEDs is disposed across the first electrical contact pad region of the first conductive line and the corresponding second electrical contact pad region of the second conductive line. Each surface mounted LED includes a first pin and a second pin, which are electrically connected to the first electrical contact pad region of the first conductive line and the second electrical contact pad region of the second conductive line by a conductive heat dissipating adhesive, respectively. Thus, each surface mounted LED forms an electrical connection with the first conductive line and the second conductive line.

In one embodiment, the first exposed section fully exposes the first conductive core, and the second exposed section fully exposes the second conductive core.

In one embodiment, the first insulating layer includes a first insulating extended portion that extends towards two ends of the first segment and partially shields the first exposed sections, and the second insulating layer includes a second insulating extended portion that extends towards two ends of the second segment and partially shields the second exposed sections.

In one embodiment, the thickness of the first electrical contact pad region on the first segment is equal to the thickness of the first insulating layer, and the thickness of the second electrical contact pad region on the second segment is equal to the thickness of the second insulating layer.

In one embodiment, the conductive heat dissipating material overflows one side of the first conductive line away from the surface mounted LED to form a first heat dissipating portion.

In one embodiment, the conductive heat dissipating material overflows one side of the second conductive line away from the surface mounted LED to form a second heat dissipating portion.

In one embodiment, a plurality of first rugged portions are formed in a recessed manner on each first exposed section to allow the conductive heat dissipating material to be seeped therein. Further, a plurality of second rugged portions are formed in a recessed manner on each second exposed section to allow the conductive heat dissipating material to be seeped therein.

In one embodiment, the lengths of the first exposed sections at the two ends of each first segment are different.

In one embodiment, the lengths of the second exposed sections at the two ends of each second segment are different.

In one embodiment, the light emitting light string further includes at least one sealing adhesive. The sealing adhesive is disposed correspondingly to each surface mounted LED, and encloses the surface mounted LED, each of the first electrical contact pad regions of the first conductive line, and each of the second electrical contact pad regions of the second conductive line.

In one embodiment, the second conductive line is disposed in parallel at a position near the first conductive line.

With the above structure, the present invention provides following features compared to the conventional solution. In the present invention, each of the conductive lines is implemented by segments, and a conductive heat dissipating material is disposed in any of the two conductive lines to form an electrical contact pad region for disposing a surface mounted LED. Thus, the waste heat generated by the surface mount LED that emits light can be dissipated via the electrical contact pad region, thereby solving the issue of waste heat accumulated in a conductive line when a conventional light emitting light string is powered on and emits light.

DETAILED DESCRIPTION OF THE PREFERRED EMBODIMENTS

Details and technical contents of the present invention are given with the accompanying drawings below.

Figure 1:
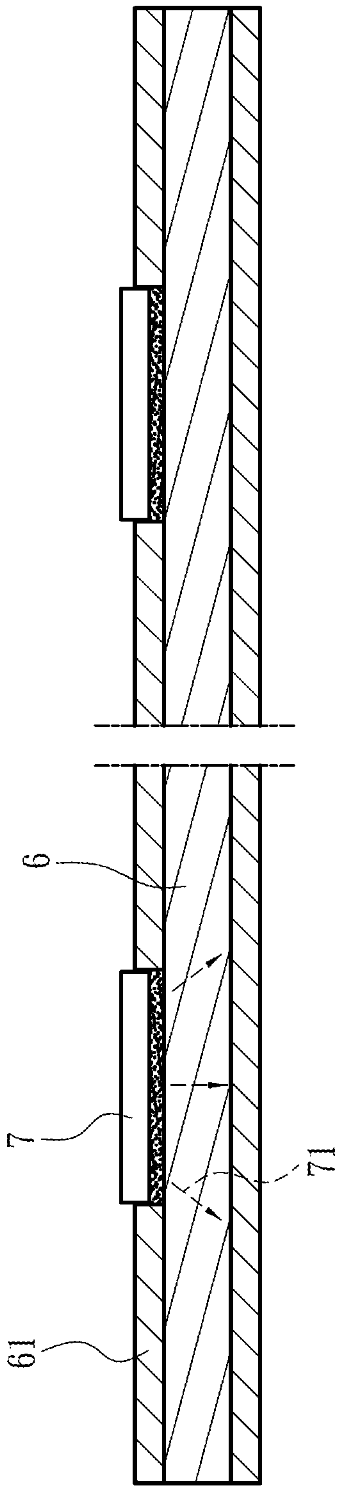
Fig. 1 PRIOR ART
FIG. 1 is a sectional view of a conventional light emitting light string.
Figure 2:
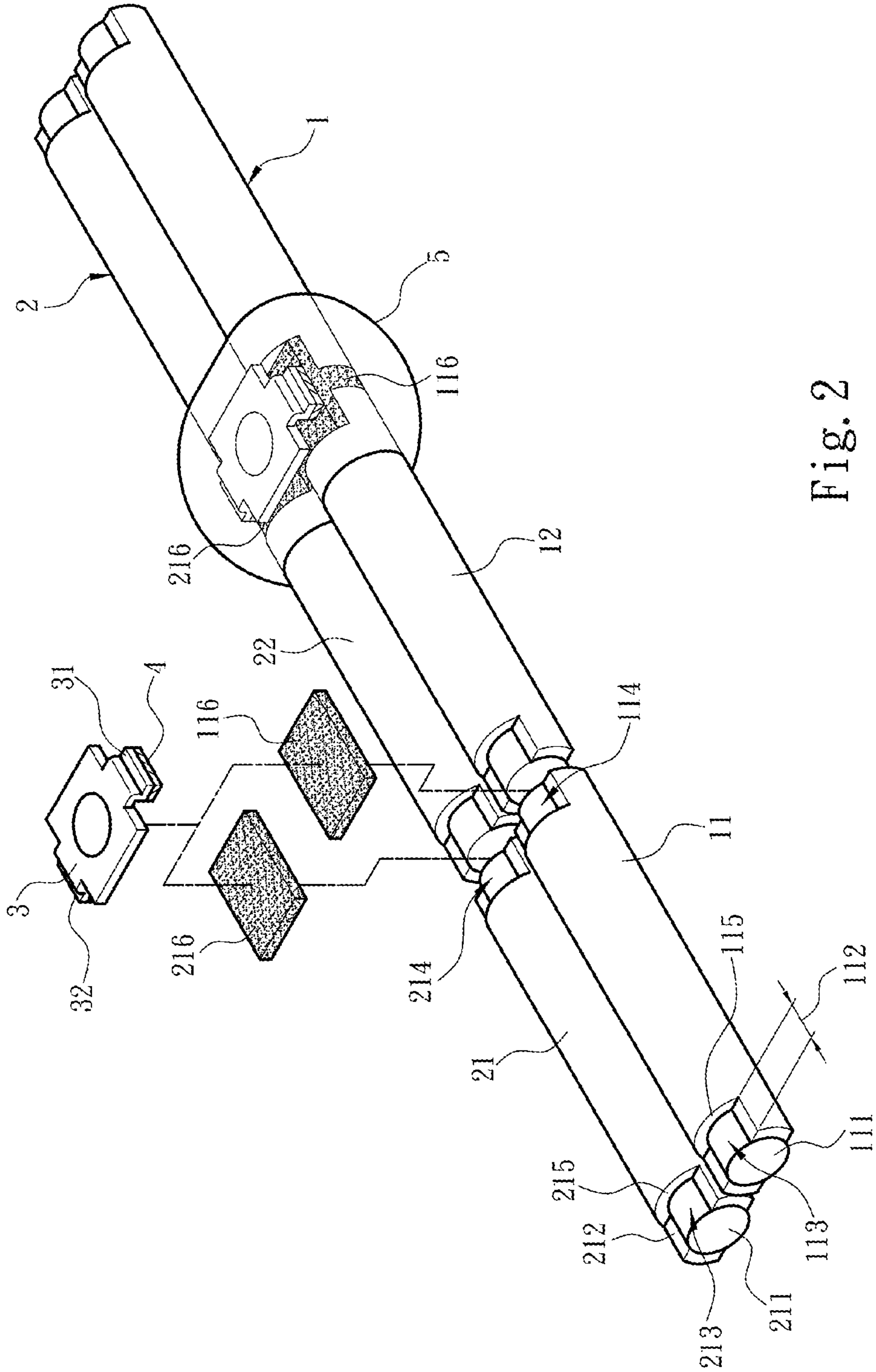
FIG. 2 is a perspective schematic diagram according to a first embodiment of the present invention.

Referring to FIG. 2, a light emitting light string with enhanced heat dissipating efficiency of the present invention includes a first conductive line 1, a second conductive line 2, and at least one surface mounted light emitting diode (LED) 3. In one embodiment, each of the first conductive line 1 and the second conductive line 2 may be implemented by an enameled insulated wire. The first conductive line 1 is formed by a plurality of first segments 11 and 12, and every two adjacent first segments 11 and 12 are connected by a conductive heat dissipating material in between. More specifically, each of the first segments 11 includes a first conductive core 111, which has each of two ends thereof as a first exposed section 112. In the present invention, the first exposed sections 112 are defined into a first exposed pad region 113 and a second exposed pad region 114. Further, the first exposed pad region 113 and the second exposed pad region 114 are respectively disposed at the two ends of the first segment 11. An exterior of the first conductive core 111 located at the remaining region of the first exposed section 112 is covered by a first insulating layer 115. The first insulating layer 115 may be disposed on a surface of the first conductive core 111 by a processing an insulating material with a procedure such as applying and coating. The conductive heat dissipating material connects the first exposed pad region 113 and the second exposed pad region 114 of the adjacent first segments 11 to form a first electrical contact pad region 116. On the other hand, in the present invention, the second conductive line 2 may be disposed in parallel at a position near the first conductive line 1. The second conductive line 2 is formed by a plurality of second segments 21 and 22. Similarly, every two adjacent second segments 21 are connected by the conductive heat dissipating material in between. Further, each of the second segments 21 includes a second conductive core 211, which has each of two ends thereof as a second exposed section 212. The second exposed sections 212 are defined into a third exposed pad region 213 and a fourth exposed pad region 214. Further, the third exposed pad region 213 and the fourth exposed pad region 214 are respectively disposed at the two ends of the second segment 21. Further, an exterior of the second conductive core 211 located at the remaining region of the second exposed section 212 is covered by a second insulating layer 215. The second insulating layer 215 may be formed by the same method used for the first insulating layer 115, and such details shall be omitted herein. Further, the conductive heat dissipating material also connects the third exposed pad region 213 and the fourth exposed pad region 214 of the adjacent second segments 21 to form a second electrical contact pad region 216.

In the present invention, the surface mounted LED 3 is disposed across the first electrical contact pad region 116 of the first conductive line 1 and the corresponding second electrical contact pad region 216 of the second conductive line 2. More specifically, the surface mounted LED 3 includes a first pin 31 and a second pin 32. The first pin 31 and the second pin 32 are connected to the first electrical contact pad region 116 of the first conductive line 1 and the second electrical contact pad region 216 of the second conductive line 2 by a conductive heat dissipating adhesive 4, respectively, such that each surface mounted LED 3 forms an electrical connection with the first conductive line 1 and the second conductive line 2. Further, the conductive heat dissipating adhesive 4 may be a silver adhesive. The light emitting light string of the present invention may further include at least one sealing adhesive 5. The sealing adhesive 5 is disposed correspondingly to each surface mounted LED 3 to enclose each surface mounted LED 3, each of the first electrical contact pad regions 116 of the first conductive line 1, and each of the second electrical contact pad regions 216 of the second conductive line 2.

Figure 3A:
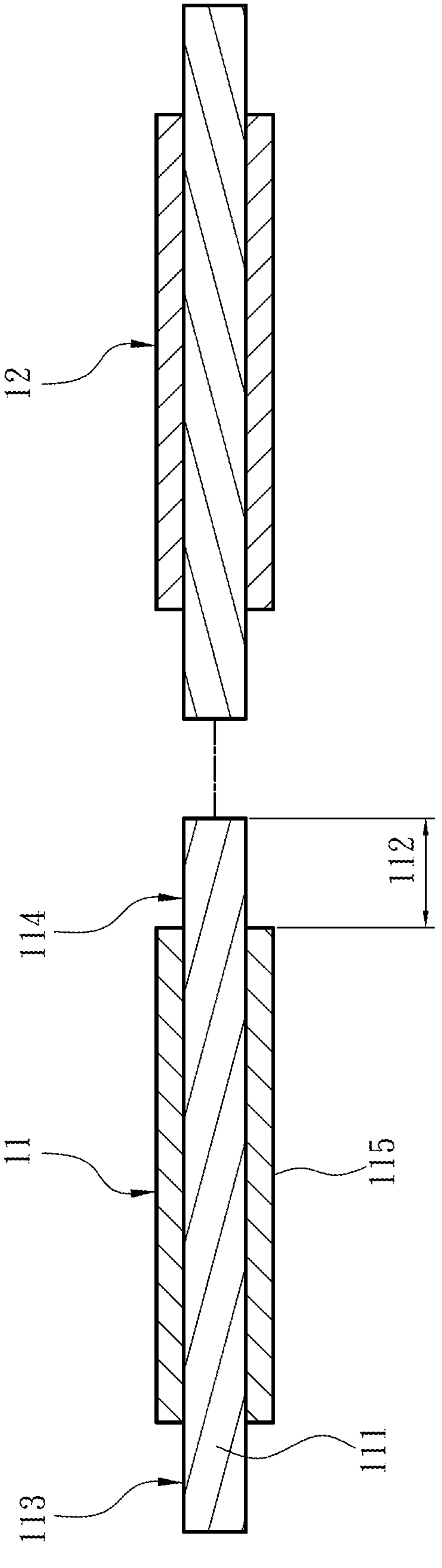
FIG. 3A to FIG. 3C are schematic diagrams showing continuous steps of the implementation according to the first embodiment of the present invention.
Figure 3B:
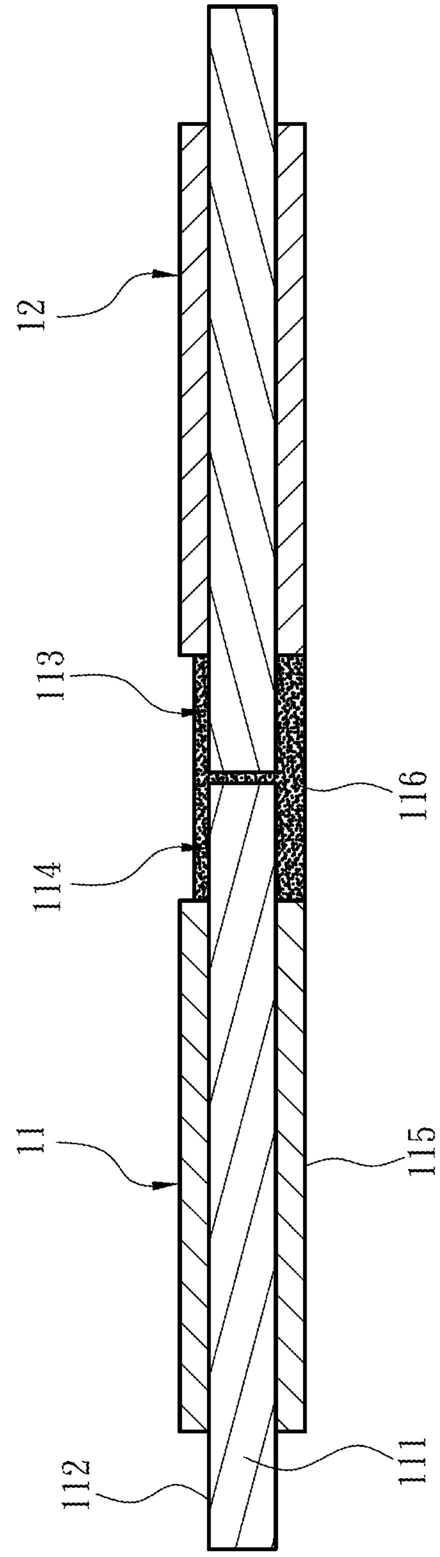
Figure 3C:
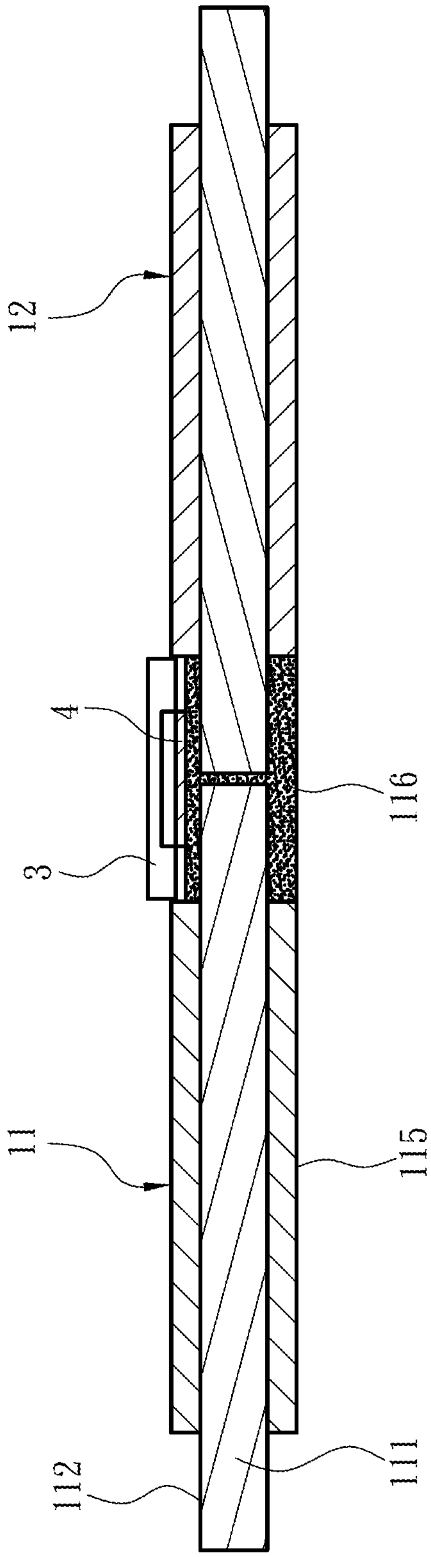

Referring to FIG. 3A to FIG. 3C, to assemble the light emitting light string of the present invention, the first conductive line 1 and the second conductive line 2 are first provided. Using mechanical processing, the first conductive line 1 is cut into a plurality of first segments 11 and 12, and the second conductive line 2 is similarly cut into a plurality of second segments 21 and 22. Lengths of the first segments 11 and 12 may further equal to those of the second segments 21 and 22. The first insulating layer 115 at the two ends of each first segment 11 is removed to form the first exposed section 112 on the first segment 11, and the first exposed pad region 113 and the second exposed pad region 114 are also formed. The second insulating layer 215 at the two ends of each second segment 21 is also removed to form the second exposed section 212 on the second segment 21. The first exposed pad region 113 of the first segment 11 is placed to face the second exposed pad region 114 of another first segment 12, and the conductive heat dissipating material is applied to form the first electrical contact pad region 116 between the adjacent first segments 11 and 12. At this point, the first electrical contact pad region 116 formed by the heat dissipating material further forms an electrical connection with the first conductive core 111, such that a current transmitted in the first conductive line 1 is allowed to flow from the first conductive core 111 through the first electrical contact pad region 116 and then to another first conductive core 111. On the other hand, details of how the second segments 21 and 22 form the second electrical contact pad region 216 are identical to those of the first segments 11 and 12, and shall be omitted herein. Next, in the present invention, the first pin 31 of one of the surface mounted LEDs 3 is fixed on the first electrical contact pad region 116 by the conductive heat dissipating adhesive 4, and the second pin 32 of the surface mounted LED 3 is also fixed on the second electrical contact pad region 216 by the conductive heat dissipating adhesive 4. As such, the light emitting light string of the present invention is complete. The manufactured light emitting light string may be applied for Christmas lights. The waste heat that each of the surface mounted LEDs 3 generates when the surface mounted LED 3 is powered and emits light is absorbed by the first electrical contact pad region 116 and the second electrical contact pad region 216. It should be noted that, in the present invention, the first electrical contact pad region 116 and the second electrical contact pad region 216 are not covered by the first insulating layer 115 and the second insulating layer 215, and are in direct contact with external air and are capable of directly performing heat exchange with the external air, thereby preventing the waste heat from accumulating in the first conductive line 1 or in the second conductive line 2.

Figure 4:
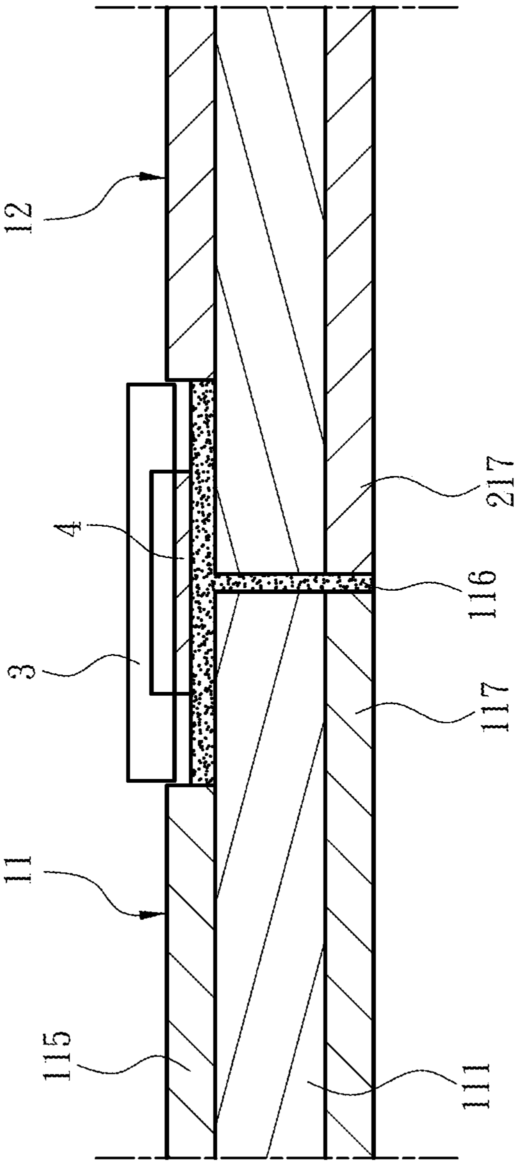
FIG. 4 is a sectional view according to a second embodiment of the present invention.
Figure 5:
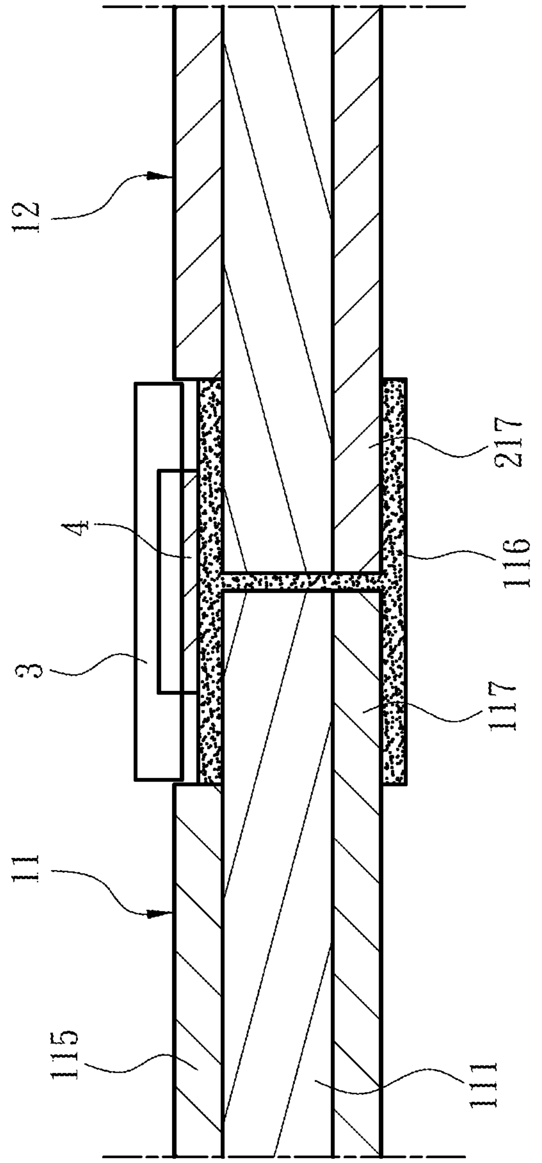
FIG. 5 is a sectional view according to a third embodiment of the present invention.

In the foregoing embodiment of the present invention, an example of the first exposed section 112 fully exposing the first conductive core 111 and the second exposed section 212 fully exposing the second conductive core 211 are given as an example for illustration purposes. Referring to FIG. 4, in another embodiment of the present invention, each first insulating layer 115 includes a first insulating extended portion 117 that extends towards the two end of the first segment 11 and partially shields the first exposed sections 112, and each second insulating layer 215 includes a second insulating extended portion 217 that extends towards the two ends of the second segments 21 and partially shields the second exposed sections 212. Further, referring to FIG. 3 to FIG. 6, in one embodiment of the present invention, in the process of forming the first electrical contact pad region 116 and the second electrical contact pad region 216 by the conductive heat dissipating material, the thicknesses of a part of the first exposed section 112 and a part of the second exposed section 212 may be designed to be equal to those of the first insulating layer 115 and the second insulating layer 215. Thus, the thickness of the first electrical contact pad region 116 on the first segment 11 is equal to the thickness of the first insulating layer 115, and the thickness of the second electrical contact pad region 216 on the second segment 21 is equal to the thickness of the second insulating layer 215.

Figure 6:
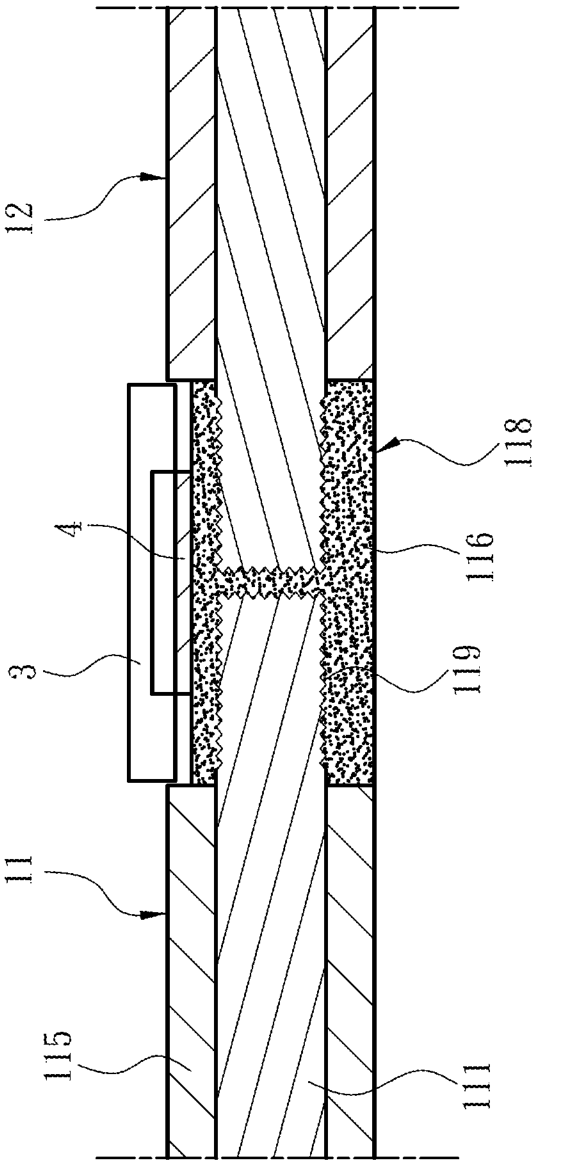
FIG. 6 is a sectional view according to a fourth embodiment of the present invention.

Referring to FIG. 6, in the present invention, in the process of forming each first electrical contact pad region 116 and each second electrical contact pad region 216, an overflow level of the conductive heat dissipating material is controlled, such that the conductive heat dissipating material overflows one side of each first segment 11 opposite the surface mounted LED 3, or the conductive heat dissipating material overflows one side of each second segment 21 opposite the surface mounted LED 3. As such, a first heat dissipating portion 118 is formed at one side of each of the first electrical contact pad regions 116 away from each surface mounted LED 3, and a second heat dissipating portion (not shown) is formed at one side of each of the second electrical contact pad regions 216 away from each surface mounted LED 3. In one embodiment of the present invention, through mechanical carving or chemical etching, a plurality of first rugged portions 119 are formed in a recessed manner on each of the first exposed sections 112, and a plurality of second rugged portions 119 (not shown) are formed in a recessed manner on each of the second exposed sections 212. The first rugged portions 119 and the second rugged portion allow the conductive heat dissipating material to be seeped therein during the process of forming the first electrical contact pad regions 116 and the second electrical contact pad regions 216 by the conductive heat dissipating material. Thus, the conductive heat dissipating material is allowed to combine with the first conductive cores 111 and the second conductive cores 211 to provide more enhanced heat dissipation effects.

Figure 7:
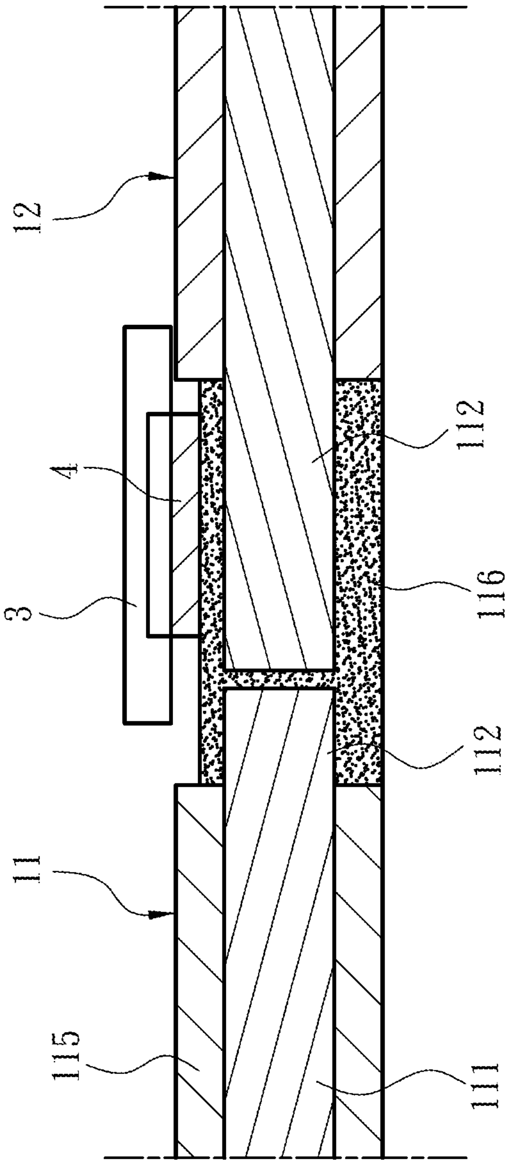
FIG. 7 is a sectional view according to a fifth embodiment of the present invention.

Referring to FIG. 7, in the present invention, the lengths of the first exposed sections 112 of two adjacent first segments 11 and 12 may be designed to be different. In other words, the lengths of the first exposed sections 112 at the two ends of the first segment 11 are different. That is to say, in one embodiment, the length of the first exposed section 112 of the first segment 11 facing another first segment 12 is different from the length of the first exposed section 112 of the another first segment 12 facing the first segment 11. Thus, each of the surface mounted LEDs 3 may be disposed at the first exposed section 112 having a longer length to more stably carry the surface mounted LED 3. Further, although the first conductive line 1 is used as an example for illustrating the present invention, the second conductive line 2 may also be implemented by the same method. Associated details are omitted herein.

What is claimed is:

1. A light emitting light string with enhanced heat dissipating efficiency, comprising:

a first conductive line, formed by a plurality of first segments, every two adjacent first segments being connected by a conductive heat dissipating material in between, each first segment comprising a first conductive core, each of two ends of the first conductive core being a first exposed section and defined into a first exposed pad region or a second exposed pad region, an exterior of a remaining region of the first conductive core covered by a first insulating layer, the conductive heat dissipating material connecting the first exposed pad region and the second exposed pad region of the adjacent first segments to form a first electrical contact pad region;

a second conductive line, formed by a plurality of second segments, every two adjacent second segments being connected by the conductive heat dissipating material in between, each second segment comprising a second conductive core, each of two ends of the second conductive core being a second exposed section and defined into a third exposed pad region or a fourth exposed pad region, an exterior of a remaining region of the second conductive core covered by a second insulating layer, the conductive heat dissipating material connecting the third exposed pad region and the fourth exposed pad region of the adjacent second segments to form a second electrical contact pad region; and at least one surface mounted light emitting diode (LED), disposed across the first electrical contact pad region of the first conductive line and the corresponding second electrical contact pad region of the second conductive line, each surface mounted LED comprising a first pin and a second pin, the first pin and the second pin electrically connected to the first electrical contact pad region of the first conductive line and the second electrical contact pad region of the second line by a conductive heat dissipating adhesive, respectively, such that each surface mounted LED forms an electrical connection with the first conductive line and the second conductive line.

2. The light emitting light string with enhanced heat dissipating efficiency of claim 1, wherein the first exposed section fully exposes the first conductive core, and a second exposing section fully exposes the second conductive core.

3. The light emitting light string with enhanced heat dissipating efficiency of claim 1, wherein the first insulating layer comprises a first insulating extended portion that extends towards two end of the first segment and partially shields the first exposed sections, and the second insulating layer comprises a second insulating extended portion that extends towards two ends of the second segments and partially shields the second exposed sections.

4. The light emitting light string with enhanced heat dissipating efficiency of claim 1, wherein a thickness of the first electrical contact pad region on the first segment is equal to a thickness of the first insulating layer, and a thickness of the second electrical contact pad region on the second segment is equal to a thickness of the second insulating layer.

5. The light emitting light string with enhanced heat dissipating efficiency of claim 1, wherein the conductive heat dissipating material overflows one side of the first conductive line away from the surface mounted LED to form a first heat dissipating portion.

6. The light emitting light string with enhanced heat dissipating efficiency of claim 5, wherein the conductive heat dissipating material overflows one side of the second conductive line away from the surface mounted LED to form a second heat dissipating portion.

7. The light emitting light string with enhanced heat dissipating efficiency of claim 1, wherein the conductive heat dissipating material overflows one side of the second conductive line away from the surface mounted LED to form a second heat dissipating portion.

8. The light emitting light string with enhanced heat dissipating efficiency of claim 1, wherein a plurality of rugged portions are formed in a recessed manner on each first exposed section to allow the conductive heat dissipating material to be seeped therein, and a plurality of rugged portions are formed in a recessed manner on each second exposed section to allow the conductive heat dissipating material to be seeped therein.

9. The light emitting light string with enhanced heat dissipating efficiency of claim 1, wherein lengths of the first exposed sections at two ends of each of the first segments are different.

10. The light emitting light string with enhanced heat dissipating efficiency of claim 9, wherein lengths of the second exposed sections at two ends of each of the second segments are different.

11. The light emitting light string with enhanced heat dissipating efficiency of claim 1, further comprising:

at least one sealing adhesive, disposed correspondingly to each surface mounted LED, enclosing the surface mounted LED, each of the first electrical contact pad regions of the first conductive line, and each of the second electrical contact pad regions of the second conductive line.

12. The light emitting light string with enhanced heat dissipating efficiency of claim 1, wherein the second conductive line is disposed in parallel at a position near the first conductive line.

* * * * *